United States Patent
Bapat et al.

(10) Patent No.: US 6,429,715 B1
(45) Date of Patent: Aug. 6, 2002

(54) DESKEWING CLOCK SIGNALS FOR OFF-CHIP DEVICES

(75) Inventors: Shekhar Bapat; Lawrence C. Hung, both of San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/482,741

(22) Filed: Jan. 13, 2000

(51) Int. Cl.[7] .............................. G06F 1/04; H03K 3/00
(52) U.S. Cl. ...................... 327/295; 327/565; 327/158
(58) Field of Search ................................. 327/292, 293, 327/295, 297, 565, 158

(56) References Cited

U.S. PATENT DOCUMENTS

| | | | | |
|---|---|---|---|---|
| 5,043,596 A | * | 8/1991 | Masuda et al. | 327/297 |
| 5,430,397 A | * | 7/1995 | Itoh et al. | 326/101 |
| 5,604,775 A | * | 2/1997 | Saitoh et al. | 375/376 |
| 5,646,564 A | | 7/1997 | Erickson et al. | 327/158 |
| 5,656,963 A | * | 8/1997 | Masleid et al. | 327/297 |
| 5,774,007 A | * | 6/1998 | Soneda | 327/292 |
| 5,870,445 A | * | 2/1999 | Farwell | 375/371 |
| 5,877,632 A | | 3/1999 | Goetting et al. | 326/50 |
| 5,999,025 A | * | 12/1999 | New | 327/156 |
| 6,111,448 A | * | 8/2000 | Shibayama | 327/293 |
| 6,163,186 A | * | 12/2000 | Kurita | 327/157 |

OTHER PUBLICATIONS

Xilinx Application Note, XAPP133, "Using the Virtex Select I/O", Version 1.2, Oct. 11, 1999, pp. 1–16.
Xilinx Application Note, XAPP132, "Using the Virtex Delay-Locked Loop", Version 1.4, Oct. 11, 1999, pp. 1–9.
XCELL, The Quarterly Journal for Programmable Logic Users, Issue 31, First Quarter 1999, "Virtex 2.5 V Field Programmable Gate Arrays", Nov. 9, 1998, Version 1.1—Advance, pp. 41–53.

\* cited by examiner

Primary Examiner—Terry D. Cunningham
Assistant Examiner—Quani Tra
(74) Attorney, Agent, or Firm—T. Lester Wallace

(57) ABSTRACT

An integrated circuit receives an external clock signal and generates therefrom a clock signal that is supplied to a plurality of external devices. A delay-locked loop (DLL), a balanced clock tree, and a plurality of interface cells on the integrated circuit function together to supply the clock signal to the plurality of external devices such that the clock signal at each of the external devices is deskewed with respect to the external clock signal. Board level design is simplified because no balanced clock tree is needed to route the clock signal from the integrated circuit to the external devices, rather each external device is coupled to a corresponding one of the interface cells via a separate external connection. Each of these external connections has an equal propagation delay. One of the interface cells supplies the clock signal back to a reference signal input of the DLL via an external connection. This external connection has the same propagation delay as the external connections to the various external devices. Matching of the propagation delays of the various external connections may be accomplished by making the external connections all of the same length.

10 Claims, 6 Drawing Sheets

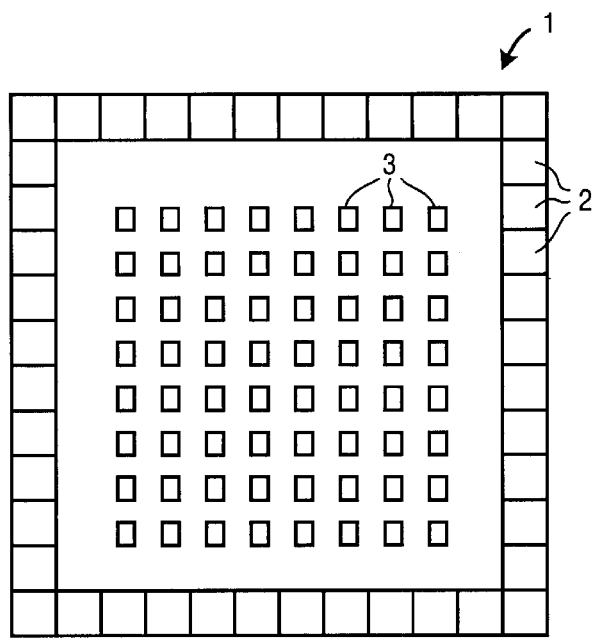
FIG. 1
(PRIOR ART)
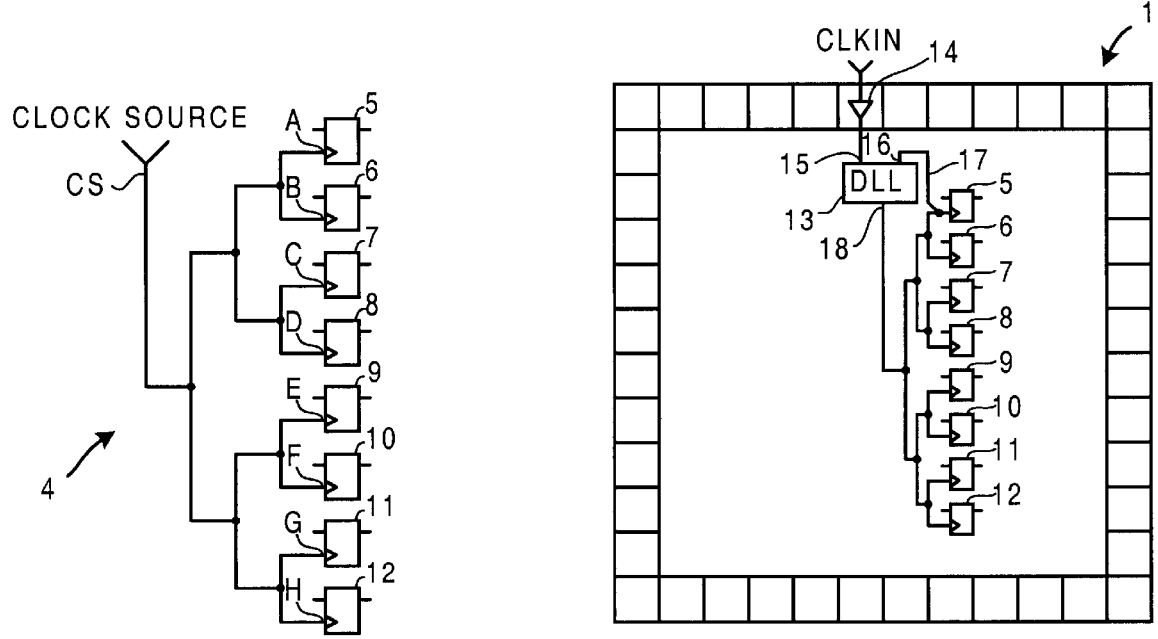
FIG. 2
(PRIOR ART)
FIG. 3
(PRIOR ART)

DESKEWING CLOCK SIGNALS FOR OFF-CHIP DEVICES

TECHNICAL FIELD

This invention relates to deskewing of clock signals, and more particularly to deskewing of clock signals for off-chip devices.

BACKGROUND INFORMATION

FIG. 1 (Prior Art) is a simplified top-down diagram of a field programmable gate array (FPGA) integrated circuit 1. Integrated circuit 1 includes a ring of interface cells 2 (sometimes called "I/O cells") and an inner core of configurable logic blocks (not shown). Each configurable logic block (CLB) contains one or more sequential logic elements. These sequential logic elements are represented in FIG. 1 as flip-flops 3. A clock signal that is received from an off-chip source is typically routed via a clock bus to numerous clock inputs of the flip-flops so that all the flip-flops are clocked together. To prevent a given clock edge from being received at one of the flip-flops before it is received at another (this is called "clock skew"), a structure called a "balanced clock tree" is employed.

FIG. 2 (Prior Art) is a simplified diagram illustrating a balanced clock tree 4. The distance a clock signal must travel from the clock source at point CS to any of the points A–H at the respective clock inputs of flip-flops 5–12 is identical. Assuming equal propagation speeds through the various branches of this balanced clock tree, the clock signal at point CS will reach points A–H at the same time. In the structure of FIG. 2 there will, however, be a propagation delay between the time a given clock edge arrives at point CS and the time when that clock edge arrives at points A–H. Where a clock signal edge is received onto an FPGA from an external source, such a propagation delay may introduce undesirable clock skew between the clock signal edge where it enters the FPGA and the clock signal edge at the clock inputs of the various flip-flops inside the integrated circuit. A circuit called a "delay-locked loop" (DLL) may be employed to reduce such clock skew.

FIG. 3 Prior Art) is a simplified diagram of FPGA 1 that uses a "delay-locked loop" (DLL) 13 to eliminate such clock skew. An external clock signal CLKIN is received onto FPGA 1 via a clock input buffer 14 and is supplied to a reference signal input 15 of DLL 13. DLL 13 has a feedback signal input 16 which is coupled to the clock input of flip-flop 5 by a short connection 17. DLL 13 delays the clock signal output by the DLL on DLL output 18 such that the phase of the clock signal at clock feedback input 16 matches the phase of the clock signal at clock input 15. The connection 17 from the clock input of flip-flop 5 to the feedback signal input 16 is made to have the same delay as the delay through clock input buffer 14 to reference signal input 15. Accordingly, the phase of the clock signal at the clock inputs of flip-flops 5–12 matches the phase of the clock signal where CLKIN is received onto FPGA 1 at the input of clock input buffer 14. The clock signal at the clock inputs of flip-flops 5–12 is therefore said to be "deskewed" with respect to the external clock signal CLKIN. For additional background information on DLLs and/or their uses in FPGAs, see: 1) U.S. patent application Ser. No. 09/102,740, entitled "Delay Lock Loop With Clock Phase Shifter", filed Jun. 22, 1998, by Hassoun et al.; 2) U.S. patent application Ser. No. 09/363,941, entitled "Programmable Logic Device With Delay-Locked Loop", filed Jul. 29, 1999, by Schultz et al.; and 3) U.S. Pat. No. 5,646,564 (the content of these three documents is incorporated herein by reference).

An FPGA may be used to drive another integrated circuit in a synchronous fashion. FIG. 4 (Prior Art) is a diagram of an implementation wherein FPGA 1 is configured to realize RAM control circuitry 20 for interfacing with an external Random Access Memory (RAM) integrated circuit 21. FIG. 5 (Prior Art) is a waveform diagram representative of signals associated with the reading of information from RAM 21.

RAM control circuitry 20 is synchronous logic realized using flip-flops inside FPGA 1. The internal clock signal that clocks these flip-flops is deskewed with respect to the external clock signal CLKIN using DLL 13 as described above in connection with FIG. 3. RAM control circuitry 20 also supplies the clock signal CLK to external RAM 21 via an interface cell 23 and an external clock line 24. To read data from a given memory location, RAM control circuitry 20 outputs the address ADDR of the memory location to be read via interface cells 25 and external address bus lines 26. (The single interface cell 25 RAM in FIG. 4 represents a plurality of interface cells that drives the address bus lines 26.) RAM control circuitry 20 also outputs a control signal CONTROL via interface cell 27 and line 28. Control signal CONTROL indicates that the operation is a read operation as opposed to a write operation.

RAM 21 examines the address ADDR and the control signal CONTROL on a rising edge 29 of the clock signal CLK. If the operation is a read operation, RAM 21 supplies the requested data back to the FBGA 1 via data bus lines 30. The RAM 21 therefore requires that the control signal CONTROL be valid at RAM 21 a given setup time before the rising edge 29 of the clock signal and remain stable a given hold time after the rising edge 29.

Because RAM control circuitry 20 is synchronous logic, clock edge 31 triggers the output of the control signal CONTROL. There is delay associated with producing and conducting this control signal to RAM 21. That delay results in control signal CONTROL arriving at RAM 21 a given time later at time 32. Similarly, clock edge 33 causes the RAM control circuitry 20 to remove the control signal CONTROL. It is removed a given time after clock edge 33 at time 34. As seen in FIG. 5, increasing the propagation delay of the clock signal between FPGA 1 and RAM 21 serves to delay the clock signal CLK AT RAM. Delaying the clock signal CLK AT RAM results in a decreased hold time 35. If this hold time 35 is too short, then the hold time required by the RAM 21 will be violated.

FIG. 6 (Prior Art) is a diagram of one conventional solution wherein a second DLL 36 deskews the clock signal CLK at point 38 on RAM 21. The connection from point 37 to point 38 and the connection from point 37 to point 39 are fashioned to have the same propagation delays. DLL 36 therefore delays the clock signal CLK such that the phase of the clock signal CLK at point 38 matches the phase of the clock signal at point 39. Because the propagation delays through the two input buffers leading into DLL 36 are the same, the phase of the clock signal CLK at point 38 matches the phase of the external clock signal CLKIN where it enters FPGA 1 at point 40.

The bottom waveform CLK AT RAM (WITH DLL) in FIG. 5 illustrates the clock signal CLK at point 38. Note that the phase of this clock signal CLK AT RAM in the bottom waveform matches the phase of the external clock signal CLKIN in the top waveform. Because the clock skew between clock signals at points 40 and 38 is eliminated, the hold time 41 between the rising edge 42 of the clock signal at RAM 21 and the control signal CONTROL is increased.

It may also be desired that such an FPGA interface with more than one external device in synchronous fashion. FIG.

7 (Prior Art) is a diagram of one conventional technique. The second DLL 36 deskews the clock signal CLK at the various external devices 56–59 with respect to the external clock signal CLKIN at point 40 as in the example of FIG. 6. The circuit of FIG. 7, however, employs a balanced clock tree so that the clock signal CLK from point 37 reaches the clock inputs 44–47 of all the RAM chips 56–59 at the same time. As in the example of FIG. 6, the propagation delay from point 37 to point 44 is made to match the propagation delay from point 37 to point 39. Because the delays through the two clock input buffers leading into DLL 36 are the same, the clock signal CLK at all the clocks inputs 44–47 is deskewed with respect to the external clock signal CLKIN at point 40. For additional background information on board level deskewing of a clock signal supplied to multiple external devices, see: Xilinx Application Note XAPP132, version 1.4, entitled "Using The Virtex Delay-Locked Loop", pages 1–9 (Oct. 11, 1999).

There are, however, drawbacks associated with the structure of FIG. 7. First, consider a situation in which output buffer 48 is an output buffer whose size and current drive capability are fixed at the time of FPGA manufacture. The current drive capability of such a buffer may, for example, be selected for driving a particular standard load. If, for example, such an output buffer 48 is sized to drive a much larger load than it is actually driving in a particular implementation, then the output buffer 48 may drive the clock signal CLK with such a high edge rate that undesirable ringing results. If, on the other hand, this output buffer 48 is sized to drive a much smaller load than it is actually driving in a particular implementation, then output buffer 48 may not be able to drive the clock signal CLK with acceptably rapid edge rates. The resulting slow edge rates may cause increased power consumption and other problems.

Second, using the structure of FIG. 7 involves the undesirable task of designing a balanced clock tree. Where FPGA 1 and the external devices 56–59 being driven are disposed on a multi-layer printed circuit board involving many crossing lines and multiple different trace widths and varying feedthrough via characteristics, design of a suitable balanced clock tree can be a time-consuming and complex task. Traces may have to be made to snake around in order to increase propagation delay, thereby wasting space on the printed circuit board. The serpentine shape 50 of the trace in FIG. 7 illustrates such wasted space.

FIG. 8 (Prior Art) illustrates one conventional design that addresses the problem of output buffer 48 being overloaded. In the example of FIG. 8, an external clock driver integrated circuit 55 is employed. Such a clock driver chip typically presents only an ordinary load on output buffer 48 but has multiple output drivers for driving many clock inputs.

The solution of FIG. 8, however, involves problems. Although the clock driver chip 55 reduces loading on output buffer 48, providing the additional clock driver chip entails the usual costs and complexities associated with adding an additional component to a design. These include increased cost, increased board area, reduced reliability, and increased power consumption. Furthermore, the data buses from external RAM devices 56–59 back to FPGA 1 may have to cross clock traces. Such crossing is represented in FIG. 8 where a data bus 60 between RAM 58 and FPGA 1 crosses clock traces 51 and 52. To prevent undesirable crosstalk and coupling problems, it is desirable that the data buses not cross the clock traces.

Accordingly, a solution is desired wherein: a single FPGA design is adapted to drive different external clock loads in different board level implementations; board level implementations of the FPGA do not involve designing complex balanced clock trees; external clock driver chips are not required; and/or clock lines and data lines leading to external chips do not cross one another.

SUMMARY

An integrated circuit (for example, a field programmable gate array) receives an external clock signal and generates therefrom a clock signal that is supplied to a plurality of external devices. These external devices may be devices that are coupled to the integrated circuit via synchronous communication.

A delay-locked loop (DLL), a balanced clock tree, and a plurality of interface cells on the integrated circuit function together to supply the clock signal to the plurality of external devices such that the clock signal at each of the external devices is deskewed with respect to the external clock signal. The DLL has a reference signal input, a feedback signal input, and an output. The reference signal input is coupled to receive the external clock signal from a source external to the integrated circuit. The output of the DLL is coupled to an input node of the balanced clock tree. Each output node of the balanced clock tree is coupled to a corresponding one of the interface cells so that all of the interface cells output the clock signal in phase with one another. Each external device receives the clock signal from a corresponding one of the interface cells via a separate external connection. Each of these external connections has an equal propagation delay. One of the interface cells supplies the clock signal back to the reference signal input of the DLL via an external connection. This external connection has the same propagation delay as each of the external connections to the various external devices. Matching of the propagation delays of the various external connections may be accomplished by simply making the external connections all of the same length. Board level design is simplified because no balanced clock tree is needed to route the clock signal from the integrated circuit to the external devices. The interface cells used to supply the clock signal to the various external devices can be separated from one another by intervening interface cells so that the intervening interface cells can be used to communicate data between the integrated circuit and the external devices. This spacing of the interface cells allows clock lines and data lines to be extended to the external device without having the clock lines cross the data lines.

Other structures and methods are disclosed in the detailed description below. This summary does not purport to define the invention. The invention is defined by the claims.

BRIEF DESCRIPTION OF THE DRAWINGS

FIG. 1 (Prior Art) is a simplified top-down diagram of a field programmable gate array.

FIG. 2 (Prior Art) is a diagram of a balanced clock tree.

FIG. 3 (Prior Art) is a simplified top-down diagram of a field programmable gate array that employs a delay-locked loop (DLL) to deskew an internal clock signal with respect to an external clock signal CLKIN.

DETAILED DESCRIPTION

Figure 9:
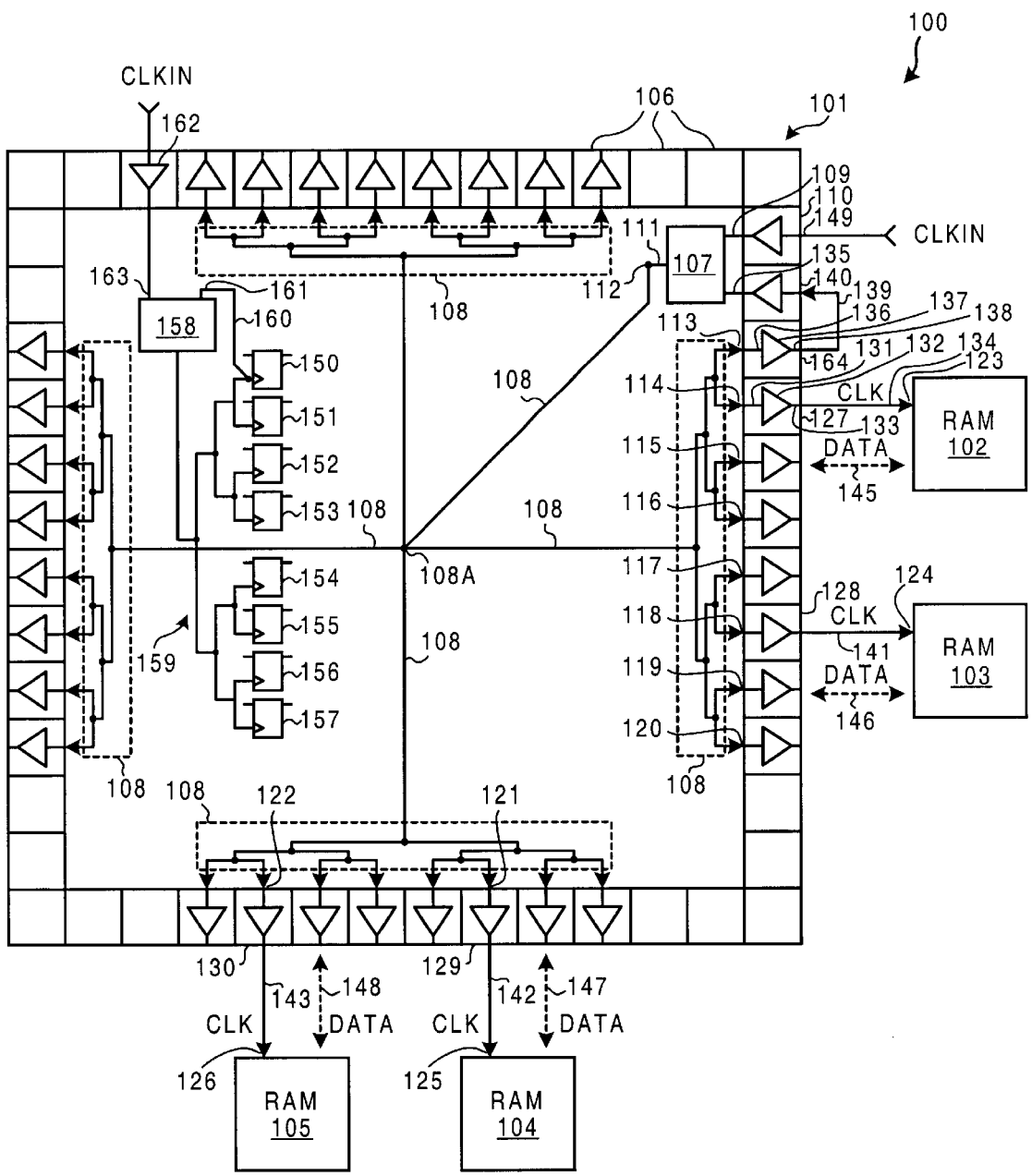
FIG. 9 is a simplified top-down diagram of a system involving a field programmable gate array and a plurality of external devices in accordance with an embodiment of the present invention.

FIG. 9 is a simplified diagram of a system 100 in accordance with an embodiment of the present invention. System 100 includes a field programmable gate array (FPGA) 101, and a plurality of external devices 102–105. In this illustrative example, the external devices are Random Access Memory (RAM) devices that are coupled to FPGA 101 in synchronous fashion. FPGA 101 includes an inner core of configurable logic blocks (not shown), a ring of interface cells 106, a delay-locked loop (DLL) circuit 107, and an on-chip balanced clock tree 108. A clock source external to FPGA 101 is coupled to a reference signal input 109 of DLL 107 via a clock input interface cell 110. The output 111 of DLL 107 is coupled to an input node 112 of the balanced clock tree 108. In some embodiments, output 111 of DLL 107 is coupled to balanced clock tree 108 by a programmable connection, whereas in other embodiments, output 111 is coupled to balanced clock tree 108 by a non-programmable connection.

Balanced clock tree 108 has a plurality of output nodes. To clarify the diagram, only some of the output nodes 113–122 are labeled in FIG. 9. In the particular balanced clock tree 108 illustrated, a clock signal at input node 112 propagates toward the center of the FPGA to node 108A. From node 108A, the clock signal propagates radially outwardly toward the output nodes at the four edges of FPGA 101. The propagation delays from the input node to the output nodes are all within plus or minus approximately eighty percent of one another.

Each of the output nodes of the balanced clock tree is coupled to a respective interface cell. These respective interface cells are of substantially identical construction. Again, to clarify the diagram, not all interface cells are labeled in FIG. 9. An individual one of these interface cells is configurable as either an input interface cell, an output interface cell, or an input/output interface cell.

In the illustrated example, clock inputs 123–126 of external RAM devices 102–105 are to receive a clock signal from FPGA 101. Accordingly, each of interface cells 127–130 is of substantially identical construction and is configured as an output interface cell. In each such output interface cell, the input of an output buffer is coupled to a corresponding output node of the balanced clock tree. In interface cell 127, for example, the input 131 of output buffer 132 is coupled to output node 114 of balanced clock tree 108. The output 133 of output buffer 132 is coupled via an external connection 134 to the clock input 123 of external RAM device 102. The clock inputs 124, 125 and 126 of the other three external RAM devices 103, 104 and 105 are coupled to receive the clock signal CLK from output nodes 118, 121 and 122 of the balanced clock tree 108 in similar fashion.

Figure 7:
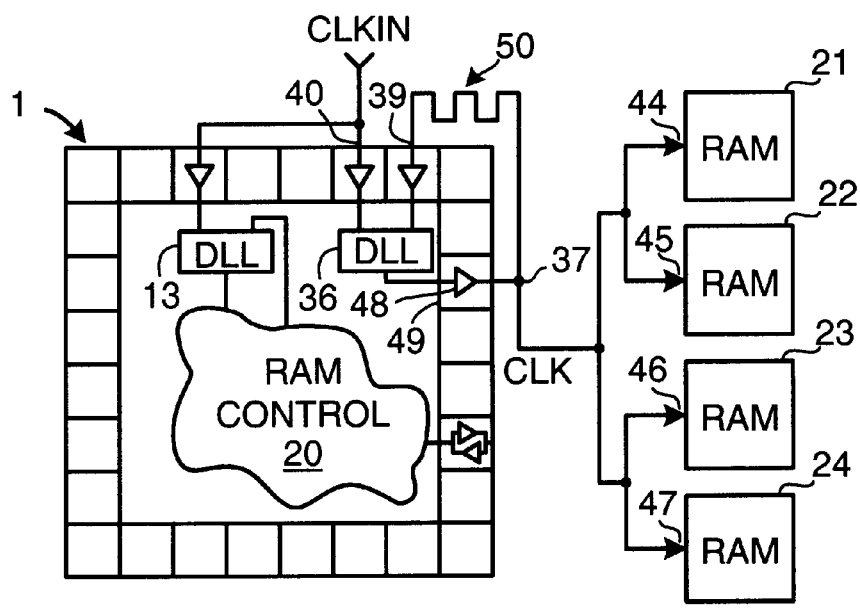
FIG. 7 (Prior Art) is a simplified top-down diagram of a system wherein a field programmable gate array is synchronously coupled to a plurality of external RAM devices via an external balanced clock tree such that a clock signal CLK at each of the clock inputs of the external RAM devices is deskewed with respect to an external clock signal CLKIN.
Figure 8:
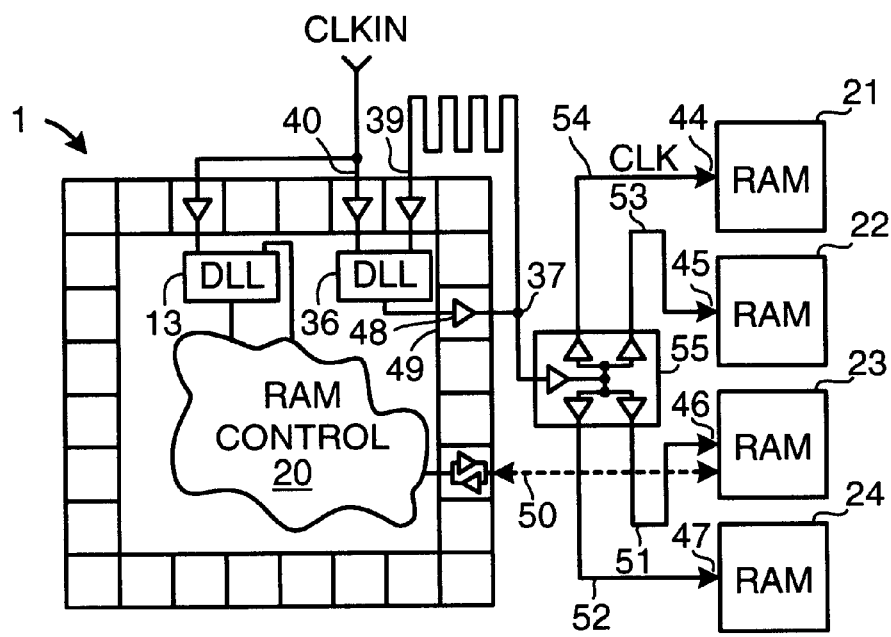
FIG. 8 (Prior Art) is a simplified top-down diagram of a system wherein a field programmable gate array is synchronously coupled to a plurality of external RAM devices via a clock driver chip such that a clock signal CLK at each of the clock inputs of the external RAM devices is deskewed with respect to an external clock signal CLKIN.

Rather than the clock inputs 123–126 of the external devices 102–105 being coupled to FPGA 101 by a complex balanced clock tree external to the FPGA 101 as in the case of FIGS. 7 and 8 (Prior Art), there is no such complex balanced clock tree external to FPGA 101 in the embodiment of FIG. 9. Each respective clock input of external devices 102–105 receives the clock signal CLK from FPGA 101 via a separate, short, substantially straight, non-branched, point-to-point external connection of similar or identical length and construction. In the illustrated example, external connection 134 is a trace on a printed circuit board. The trace is a substantially straight trace with no branches that extends from the right-most edge of FPGA 101 in a direction substantially perpendicular to the direction of the edge.

Unlike output nodes 114, 118, 121 and 122 of balanced clock tree 108 that are coupled to clock inputs of the external devices, one of the output nodes 113 of balanced clock tree 108 is coupled back to a feedback signal input 135 of DLL 107. Interface cell 164 is therefore configured as an output interface cell. The input 136 of output buffer 137 of interface cell 164 is coupled to output node 113 of balanced clock tree 108 whereas the output 138 of output buffer 137 is coupled to feedback signal input 135 via an external connection 139 and a clock input interface cell 140.

It is desired that the clock signal CLK supplied to the clock inputs 123–126 of external devices 102–105 be deskewed with respect to the external clock signal CLKIN where the external clock signal enters FPGA 101 at point 149. External connections 139 and 134 are fashioned to have the same propagation delays. Because the propagation delay through the clock input interface cells 110 and 140 is identical, the phase of the clock signal CLK at clock input 123 of RAM 102 matches the phase of the external clock signal CLKIN at point 149. Because external connections 134, 141, 142 and 143 are made to have the same propagation delays, the phases of the clock signal CLK at the clock inputs of the other external devices 103, 104 and 105 also match the phase of the external clock signal CLKIN at point 149.

Not only is the clock signal CLK supplied to the external devices deskewed with respect to the external clock signal CLKIN, but the clock signal internal to the FPGA 101 that clocks the flip-flops in the inner core of the FPGA 101 is also deskewed with respect to the external clock signal CLKIN. Flip-flops 150–157 in FIG. 9 represent flip-flops in configurable logic blocks of the inner core. There may, for example, be one such flip-flop in each configurable logic block. A DLL 158 supplies an internal clock signal to the clock inputs of these flip-flops via a balanced clock tree 159. A connection 160 from the clock input of one of these flop-flops 150 to a feedback signal input 161 of DLL 158 is made to have the same propagation delay as the propagation delay of external clock signal CLKIN into the FPGA 101 through clock input buffer 162 to a reference signal input 163 of DLL 158. Because the propagation delays through these two paths is substantially the same, the phase of the clock signal at the clock inputs of flip-flops 150–157 matches the phase of the external clock signal CLKIN where CLKIN enters FPGA 101 at the input of clock input buffer 162. The internal clock signal is therefore said to be deskewed with respect to the external clock signal CLKIN.

Figure 4:
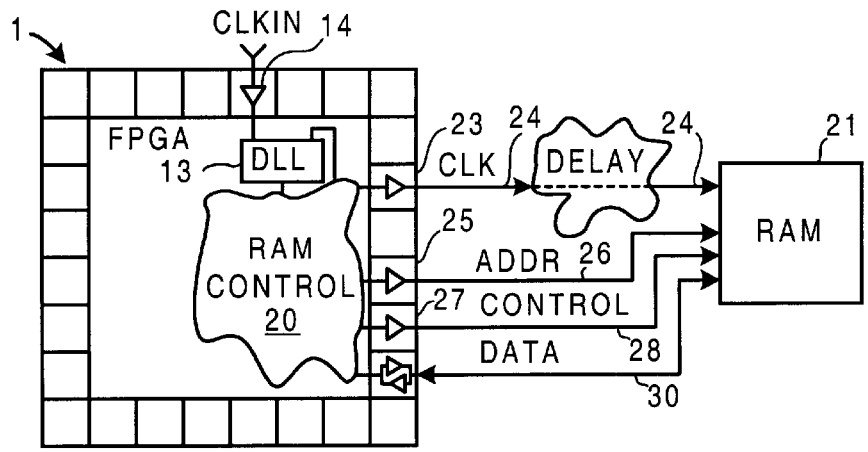
FIG. 4 (Prior Art) is a simplified top-down diagram of a system wherein a field programmable gate array is synchronously coupled to an external random access memory (RAM) device.
Figure 5:
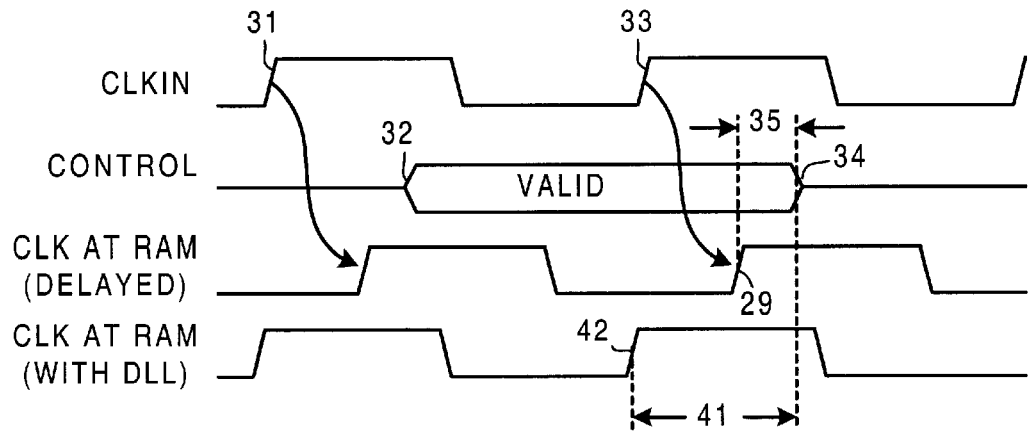
FIG. 5 (Prior Art) is a waveform diagram illustrative of signals passing between the field programmable gate array and the external RAM device of FIG. 4.
Figure 6:
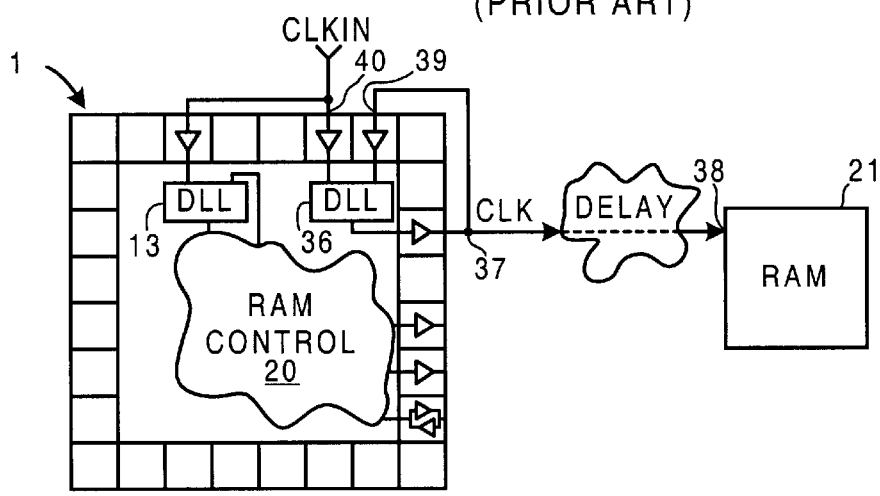
FIG. 6 (Prior Art) is a simplified top-down diagram of a system wherein a field programmable gate array is synchronously coupled to an external RAM device such that a clock signal CLK at the clock input of the external RAM device is deskewed with respect to an external clock signal CLKIN.

In an operational example wherein FPGA 101 reads data from RAM devices 102–105, RAM control circuitry is realized using configurable logic blocks of FPGA 101. The clock signal clocking the flip-flops of this circuitry is deskewed with respect to the external clock signal CLKIN by DLL 158 and balanced clock tree 159. Similarly, the clock signal CLK supplied to the clock inputs 123–125 of the external devices 102–105 is deskewed with respect to the external clock signal CLKIN by DLL 107 and balanced clock tree 108. Accordingly, the increased hold time afforded by the bottom waveform of FIG. 5 is achieved without the use of a clock distribution tree external to FPGA 101. Moreover, board level design is simplified because the printed circuit board designer need not design a complex clock distribution tree on the printed circuit board as in the case of FIG. 7. The board level designer merely needs to ensure that the traces 139, 134, 141, 142 and 143 have equal propagation delays. Generally this is easily accomplished by making traces 139, 134, 141, 142 and 143 of equal lengths.

The prior art problem of driving a variable number of external devices with an output buffer of fixed size as explained in connection with FIG. 8 is also mitigated or solved. In the system of FIG. 9, the output buffer of each of interface cells 164, 127, 128, 129 and 130 drives a single standard clock input load. In one embodiment, the input of clock input interface cell 140 of FPGA 101 has a standard clock input load of four to eight picofarads. If a larger number of external devices is to be driven in a given use of FPGA 101, then FPGA 101 is configured so that a correspondingly larger number of output buffers is employed. Because each output buffer drives only a single load in the embodiment of FIG. 9, the output buffer is sized appropriately when the FPGA is designed for the anticipated single load to be driven. In the case where the output buffer is configurable, one of the selectable output drive strengths is designed for the anticipated single load to be driven.

Whereas in the prior art example of FIG. 8 data line traces 50 cross clock line traces 51 and 52, in the embodiment of FIG. 9 the clock line traces 134, 141, 142 and 143 do not cross data line traces 145–148. The interface cells used for outputting the clock signal are spaced from one another such that there are intervening interface cells. These intervening interface cells are used for communicating data, thereby allowing the external data lines 145–148 to run to the external devices without crossing clock lines 134, 141, 142 and 143.

The placement of DLLs 107 and 158 in the diagram of FIG. 9 is merely illustrative. The DLLs may be disposed close to one another so that the input clock buffer through which the external clock signal CLKIN passes on its way into FPGA 101 is shared by the two DLLs 107 and 158. One or both of DLLs 107 and 158 can be disposed in a corner interface cell of FPGA 101. The balanced clock tree 108 may be fashioned substantially from a single layer of interconnect. The thickness of the interconnect making up the tree may vary from thick to thin, the trunk portion of the tree (starting at the input node) consisting of the thickest interconnect, the branches consisting of thinner interconnect, and the leaves (ending at the output nodes) consisting of the thinnest interconnect.

Although the external connection 139 that feeds back clock signal CLK from one of the output buffers is a separate connection in the embodiment of FIG. 9 from the external connections 134, 141, 142 and 143 that supply clock signal CLK to the external devices, this need not be the case. External connection 139, rather than supplying clock signal CLK from output interface cell 164 to the input of interface cell 140, can supply clock signal CLK from one of output interface cells 127–130 to the input of interface cell 140 provided that the clock signal CLK at the input of interface cell 140 is in phase with respect to the clock signal CLK at the clock inputs of the external devices. Clock signal CLK output by buffer 132 can be supplied to both clock input 123 as well as to the input of interface cell 140 via a branched connection wherein one of the branches extends to clock input 123 and another of the branches extends to interface cell 140.

In one embodiment, the architecture of FPGA 101 is that of the Virtex family of FPGAs available from Xilinx Inc. of San Jose, Calif. For additional information on the architecture and operation of a Virtex FPGA, see: 1) "Virtex Data Sheet", Xcell—The Quarterly Journal For Programmable Logic Users, issue 31, pages 41–53 (first quarter 1999); and 2) Xilinx Application Note XAPP 133, entitled "Using the Virtex SelectIO", version 1.11, pages 1–12 (Oct. 21, 1998) (the content of these two documents is incorporated herein by reference).

Figure 10:
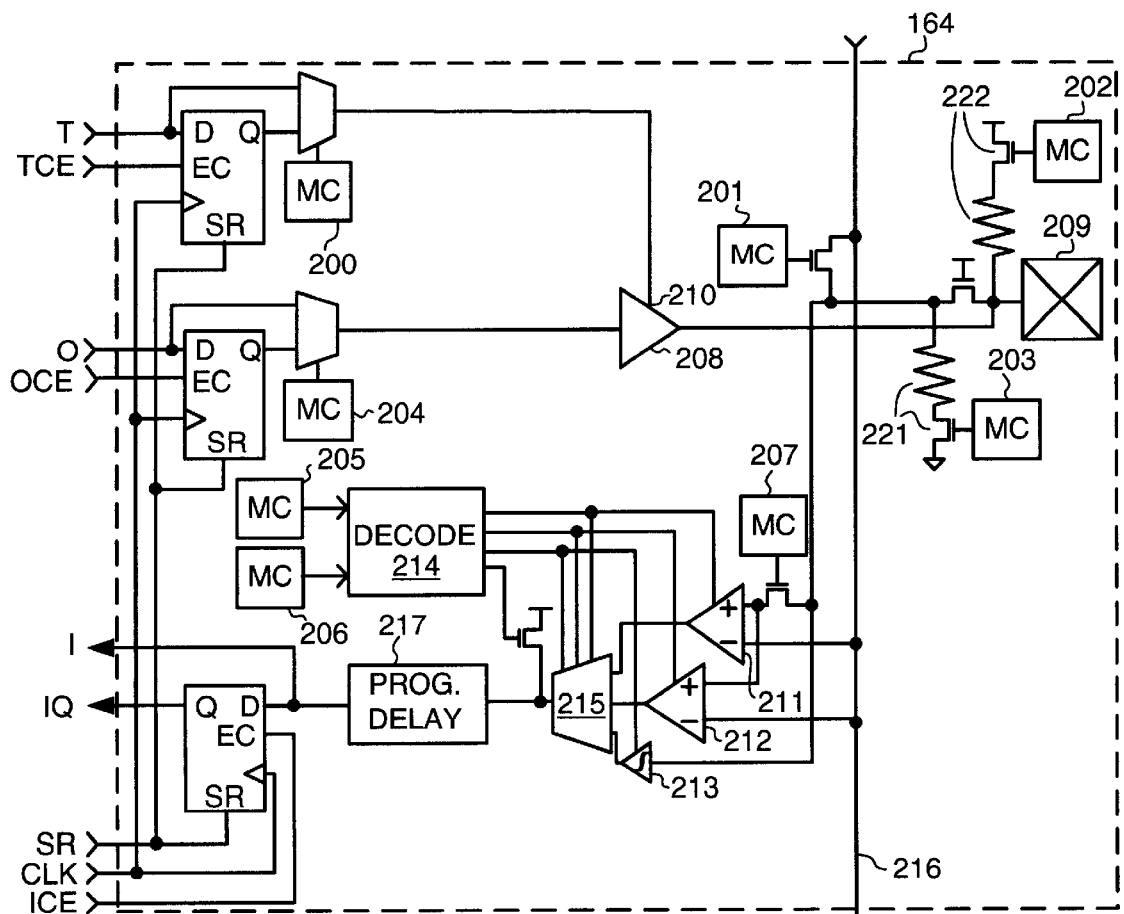
FIG. 10 is a simplified diagram of one suitable implementation of an interface cell in the embodiment of FIG. 9 in accordance with an embodiment of the present invention.

FIG. 10 is a simplified top-down circuit diagram of one suitable implementation of interface cell 164. Interface cell 164 can be configured as an input interface cell, an output interface cell, or a bidirectional interface cell, depending how memory cells 200–207 are programmed. When interface cell 164 is configured as an output interface cell, an output signal is supplied to the input of output buffer 208 and output buffer 208 outputs the signal onto bonding pad 209. A digital high is placed on an enable input 210 of the output buffer to enable the output buffer.

To configure interface cell 164 as an input interface cell, a digital low is placed on enable input 210 of output buffer 208 so that output buffer 208 is disabled. The input signal from bonding pad 209 is supplied to the positive differential inputs of comparators 211 and 212 and to Schmitt trigger 213. A reference voltage (for example, 1.5 volts) from a reference voltage line 216 is supplied to the negative differential inputs of comparators 211 and 212. The output of one of comparator 211, comparator 212, and Schmitt trigger 213 is selected via decode logic 214 and conducted via multiplexer 215 and programmable delay block 217 to the inner core of the FPGA. Comparator 211 is used for one I/O standard and comparator 212 is used for another I/O standard. The programming of memory cells (not shown) determines the magnitude of the delay of programmable delay block 217. Incoming data and/or outgoing data can be registered or not registered. Pullup devices 222 and pulldown devices 221 are programmable to provide either a resistive pullup on bonding pad 209, a resistive pulldown on bonding pad 209, or a weak keeper on bonding pad 209. For additional information on such an interface cell, see: U.S. Pat. No. 5,877,632 entitled "FPGA With A Plurality Of I/O voltage Levels" (the subject matter of which is incorporated herein by reference).

Figure 11:
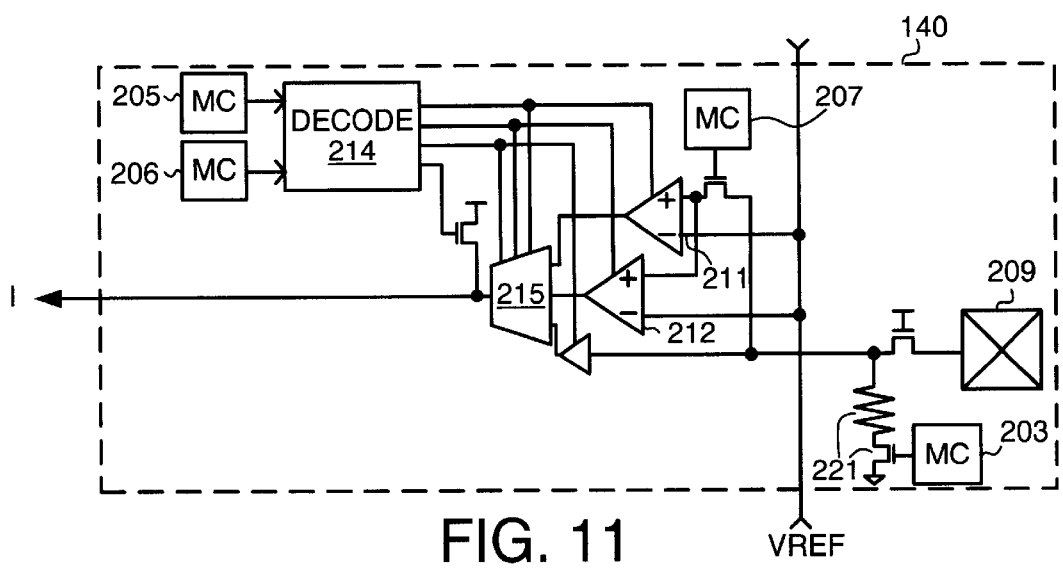
FIG. 11 is a simplified diagram of one suitable implementation of a clock input interface cell in the embodiment of FIG. 9 in accordance with an embodiment of the present invention.

FIG. 11 is a simplified diagram of one suitable implementation of clock input interface cell 140.

Figure 12:
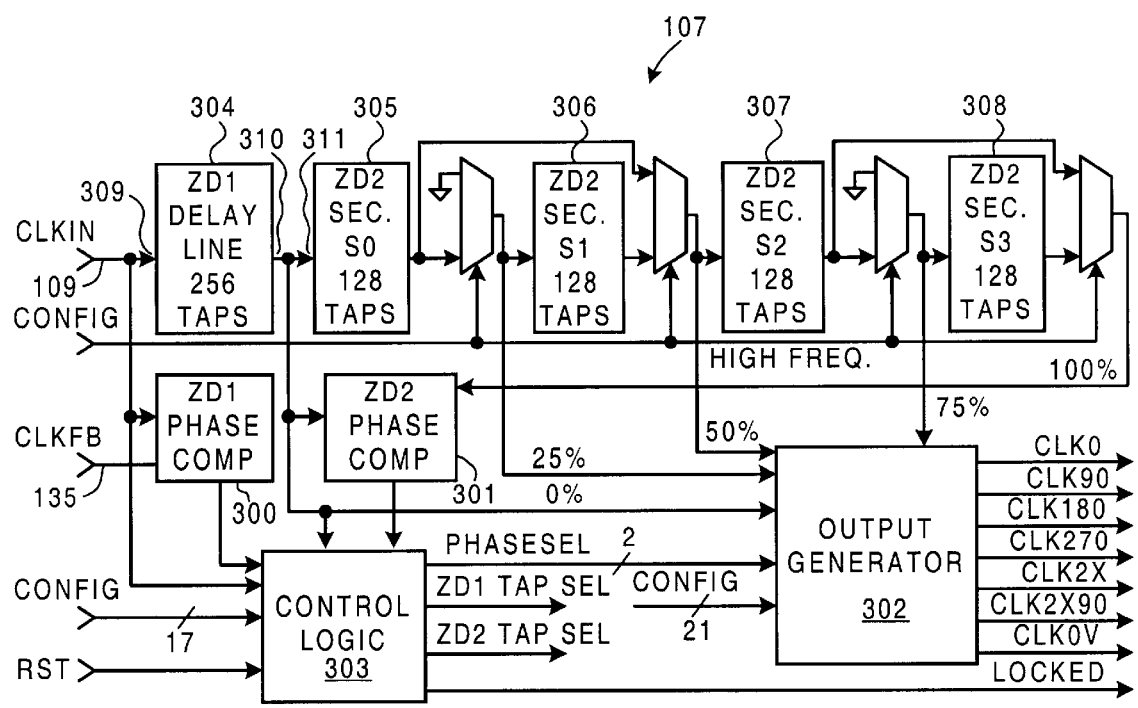
FIG. 12 is a simplified block diagram of one suitable implementation of a delay-locked loop (DLL) in the embodiment of FIG. 9 in accordance with an embodiment of the present invention.

FIG. 12 is a block level diagram of one suitable implementation of DLL 107. This DLL implementation includes two phase comparators 300 and 301, an output generator 302, control logic 303, and two delay lines. The first delay line is composed of a single delay line section 304 with 256 programmable taps. The second delay line is composed of four delay line sections 305–308 (designated S0 through S3) each containing 128 programmable taps. Signal CLKIN drives the input 309 of delay line 304. The output 310 of delay line 304 feeds the input 311 of delay line section 305 (S0).

This DLL implementation actually includes two delay-locked loops, designated ZD1 and ZD2 in FIG. 12. ZD1 includes the first delay line whereas ZD2 includes the second delay line. "ZD" means "zero delay" because delaying an integral number of periods is effectively the same as zero phase delay. Each tap of the delay line section represents about 150 picoseconds of delay (typically). In addition to the tapped delay lines, ZD1 and each section of ZD2 is followed by a four-unit trimmer delay that provides a fine delay control. Each trim unit is typically about 38 picoseconds long, so the four trim units together are about the same length as one tap delay.

A programmable delay line unit is composed of a tapped delay line with a multiplexer that selects one of the taps. Delay line tap number selections are counted in Gray code. Tap selection changes to a specific delay line are made immediately after the output of that delay line multiplexer goes high. The tap switch is made with 3-state multiplexers driven by a decode of the Gray count. This ensures that no glitches are created when the tap selection is changed to an adjacent tap. (During operation, there are no tap changes except to an adjacent tap.) Trim number selections are also counted in Gray code, and the trim selection method is similar to that of tap selection.

The ZD2 delay-locked loop is comprised of only the ZD2 delay line sections S0–S3. It is locked when the total delay between its input and output is one CLKIN period. (If the high-frequency primitive is used, only sections S0 and S2 are used; S1 and S3 are bypassed with two-input multiplexers.) When the ZD2 delay-locked loop is locked, the total delay is evenly distributed between all the sections that are used, so the outputs of S0, S1 and S2 represent 25, 50 and 75 percent, respectively, of the CLKIN period. Thus, the outputs of the sections can be used by output generator 302 to correct the duty cycle and/or double the frequency.

The ZD1 delay-locked loop is typically comprised of the ZD1 delay line, zero or more sections of the ZD2 delay line, output generator 302, and a clock driver tree (not shown). The ZD1 delay-locked loop is locked when the total loop delay is one CLKIN period. (At higher frequencies, the total delay may be two or three periods.) Because the signal sources for both CLKIN and CLKFB are configurable, the ZD1 loop may differ from the typical outlined here. For example, output signal CLK0 could go off-chip, then come back on-chip to feed the CLKFB input. A two-bit bus, PHASESEL, specifies the number of ZD2 delay line sections that are inserted in the ZD1 delay-locked loop. CLKFB must be ultimately sourced from either CLK0 or CLK2X. When the DLL is locked, CLK0 will always be in phase with CLKIN, even if CLK2X drives CLKFB.

Output generator 302 converts the signal on input 311 of the ZD2 delay-locked loop as well as the outputs of S0, S1 and S2 into the various DLL output signals. Edge-sensitive SR flip-flops are used to generate the output signals.

Control logic 303, which is synchronized, contains state machines, counters, and other circuitry needed to control the other logic during lock-up and operation. Various configuration bits CONFIG specify static operating conditions, such as high or low frequency mode, or duty cycle operation.

At reset (signal on RST input is high), the zero tap (minimum delay) is selected for all delay lines, and the control logic is initialized. When the reset signal on the RST input goes low, the loop locking process commences. The goal is to get both loops locked as quickly and accurately as possible.

The ZD2 delay-locked loop is locked first. The delay line 304 of the ZD1 delay-locked loop remains at tap zero while the taps of the delay line sections 305–308 of the ZD2 delay-locked loop are incremented. During the initial phase of the ZD2 locking process, the taps of all sections 305–308 are incremented simultaneously, so the delay is evenly distributed between the four sections (two sections in high-frequency mode).

When ZD2 phase comparator 301 indicates that the ZD2 delay line taps have been incremented beyond the ideal lock point (i.e. total delay changes from less than one period to more than one period), then a "near-locked state" is entered. In the near-locked state, control logic 303 enters a "fine-tune mode" in which the delay is reduced with both the trimmers and taps until phase comparator 301 indicates that the ZD2 delay line is less than one period long. When this point is reached, the ZD2 delay line is as close as possible to the ideal length, and a "ZD2 lock status" flag is set. During the fine-tuning phase, each adjustment consists of only one trim position (with the tap adjusted when the trim position wraps around).

When the ZD2 lock status flag is set, the ZD1 locking process begins. During the ZD1 locking process, the ZD2 delay-locked loop is held in a dormant state. Unlike the ZD2 delay-locked loop, the ZD1 delay-locked loop has only one adjustable delay line section 304; but other factors increase the complexity of the ZD1 locking process. One complicating factor is that the ZD1 delay-locked loop must not be allowed to lock near the end points of its delay line. If this were to happen, then the DLL might not be able to compensate for environmental changes during operation, which would result in a failure. Lower and upper operating margins are defined as delay line taps 42 and 173, respectively. Another complicating factor is that one, two, or three sections of the ZD2 delay line may be switched into the ZD1 delay-locked loop during the ZD1 locking process in order to extend the total length of the ZD1 loop.

The ZD1 locking process is similar to the ZD2 process in that it scans quickly to a near-locked condition, and then fine tunes until the delay is as close as possible to the ideal length. ZD1 locking starts by incrementing the tap selection from zero to the upper margin. If near-lock has not been achieved when the upper margin is reached, then one section of the ZD2 delay line is switched into the loop, and the tap selection is decremented until near near-lock is achieved, or the lower margin is reached. If needed, one or two more of the ZD2 delay line sections can be switched into the loop, with ZD1 scanned between its margins each time. If the input frequency, temperature, and voltage are within specifications, then the ZD1 delay-locked loop will achieve a "near-locked state" with 0, 1, 2 or 3 ZD2 delay line sections included in the loop. In the near-locked state, control logic 303 enters a "fine-tune" mode in which the delay is changed with both the trimmers and taps until phase comparator 300 indicates a transition from too short to too long (or vice versa, depending on the scan direction). When this point is reached, the ZD1 delay line is as close as possible to the ideal length, and the LOCKED signal is set true. The ZD1 and ZD2 delay-locked loops then enter normal operating made. Both loops dynamically adjust to changing conditions, so the skew between the high-going clock edges into the phase comparators is minimized.

The output of each of the phase comparators 300 and 301 always indicates that the delay is too short or too long (never just right). The smallest delay line adjustment is a trim unit, so under ideal conditions (and no jitter filtering), a delay-locked loop will ping-pong between two adjacent trim positions.

Reaction to changes from the ZD1 and ZD2 phase comparators 300 and 301 can be moderated with jitter filters. Each jitter filter is essentially an up-down counter that starts in the middle. Each time the phase is checked, the counter is incremented or decremented, depending on the phase check result. However, the delay line adjustment does not occur until the counter reaches zero or its maximum value. Thus, clock signal jitter that averages zero can be ignored.

The width of both the ZD1 and ZD2 jitter filter counters is programmable with configuration bits. The minimum counter width is zero bits (no jitter filtering), and the maximum width is eight bits. After both delay-locked loops are locked, the LOCKED signal stays true until RST is activated, or until one of the delay lines attempts to increment or decrement off its end. Should the latter occur, then LOCKED signal is deactivated to alert the user that the delay-locked loop is operating beyond the specified environmental conditions, and failure may occur if the extreme condition is not corrected.

For additional background information on the structure and operation of such a DLL, see: 1) U.S. patent application Ser. No. 09/102,740, entitled "Delay Lock Loop With Clock Phase Shifter", filed Jun. 22, 1998, by Hassoun et al.; 2) U.S. patent application Ser. No. 09/363,941, entitled "Programmable Logic Device With Delay-Locked Loop", filed Jul. 29, 1999, by Schultz et al.; 3) U.S. Pat. No. 5,646,564; and 4) Xilinx Application Note, XAPP132, version 1.31, entitled "Using The Virtex Delay-Locked Loop", pages 1–14 (Oct. 21, 1998) (the content of these four documents is incorporated herein by reference).

Although the present invention is described in connection with certain specific embodiments for instructional purposes, the present invention is not limited thereto. A phase-locked loop (PLL) that outputs a digital signal can be used in the place of the DLLs in the embodiments described above. The balanced clock tree of FIG. 9 is but one example of a balanced clock tree. Balanced clock trees having many different structures can be employed. Balanced clock trees can include programmable elements and/or active elements. The clock signal CLK at external devices need not be deskewed with respect to external clock signal CLKIN where that external clock signal is received onto the FPGA. In some embodiments, clock signals at external devices are deskewed with respect to a clock signal at a location internal to the FPGA. An interface cell need not be a square or block when viewed from a top-down perspective but rather can have an irregular shape. Although clock input buffers are used to conduct signals from outside the integrated circuit to the reference signal input and the feedback signal input of the DLLs in some embodiments, no such active circuitry is necessary. An interface cell having a simple bonding pad and metal interconnect may be used in some embodiments to conduct a signal from outside the integrated circuit to the DLL without the signal passing through any active circuit elements inside the interface cell. In some embodiments, the output nodes of the on-chip balanced clock tree are not coupled to output buffers, rather the output buffers are omitted and the output nodes are coupled directly to bonding pads in some embodiments. Accordingly, various modifications, adaptations, and combinations of various features of the described embodiments can be practiced without departing from the scope of the invention as set forth in the claims.

What is claimed is:

1. A programmable logic device integrated circuit, comprising:
    a balanced clock tree having an input node and a plurality of output nodes;
    a delay-locked loop circuit having a reference signal input, a feedback signal input, and an output, the output being coupled to the input node of the balanced clock tree;
    a plurality of interface cells disposed along an edge of the programmable logic device integrated circuit, each of said interface cells comprising an output buffer, each of said output buffers being adapted for driving a signal off-chip, each of said output buffers having an input and an output, the input of each output buffer being coupled to a corresponding respective one of the output nodes of the balanced clock tree; and
    a matrix of configurable logic blocks (CLBs), the plurality of interface cells being disposed in a row between the matrix of configurable logic blocks and the edge of the programmable logic device integrated circuit.

2. An integrated circuit, comprising:
    a balanced clock tree having an input node and a plurality of output nodes;
    a delay-locked loop circuit having a reference signal input, a feedback signal input, and an output, the output being coupled to the input node of the balanced clock tree; and
    a plurality of interface cells, each of said interface cells comprising an output buffer, each of said output buffers being adapted for driving a signal off-chip, each of said output buffers having an input and an output, the input of each output buffer being coupled to a corresponding respective one of the output nodes of the balanced clock tree,
        wherein the integrated circuit is rectangular and has four edges viewed from a top-down perspective, and wherein some of the interface cells are disposed along one of the edges, and wherein others of the interface cells are disposed along another of the edges.

3. A system, comprising:
    a first integrated circuit comprising:
        a delay-locked loop circuit having a reference signal input, a feedback signal input, and an output;
        a balanced clock tree having an input node and a plurality of output nodes, the input node being coupled to the output of the delay-locked loop circuit;
        a plurality of output buffers, each of the output buffers having an input and an output, the input of each output buffer being coupled to a corresponding respective one of the output nodes of the balanced clock tree;

a plurality of second integrated circuits, each of the second integrated circuits having an input;

a first plurality of connections external to the first integrated circuit and external to the second integrated circuits, each of the first plurality of connections coupling the output of a corresponding respective one of the plurality of output buffers to the input of a corresponding respective one of the plurality of second integrated circuits; and a second connection external to the first integrated circuit and external to the second integrated circuit, the second connection coupling the output of one of the output buffers to the feedback signal input of the delay-locked loop circuit, the second connection being a connection separate from each of the first plurality of connections, wherein each of the first plurality of connections extends from an edge of the first integrated circuit, said connection extending in a dimension substantially perpendicular to the edge, and wherein each of the first plurality of connections extends all the way from the first integrated circuit to a corresponding respective one of the second integrated circuits in a substantially straight line.

4. A system, comprising:

a plurality of first integrated circuits; and a second integrated circuit comprising a terminal and means for supplying an output clock signal to each of the first integrated circuits, an input clock signal being received onto the second integrated circuit on the terminal, the means also being for deskewing the output clock signal with respect to the input clock signal such that there is no balanced clock tree conducting the output clock signal from the second integrated circuit to any of the first integrated circuits and such that a phase of the output clock signal at the first integrated circuit matches a phase of the input clock signal on the terminal, wherein each of the first integrated circuits receives the output clock signal from the second integrated circuit via a separate connection, each of the separate connections being of substantially equal length, wherein one of the separate connections extends from the second integrated circuit in a first direction in substantially a straight line, and wherein a second of the separate connections extends from the second integrated circuit in a second direction in substantially a straight line, the first and second directions being substantially perpendicular to one another.

5. A field programmable integrated circuit having four edges when viewed from a top-down perspective, the field programmable integrated circuit comprising:

an inner core of configurable logic blocks;

a balanced clock tree having an input node and a plurality of output nodes;

a delay-locked loop circuit having a reference signal input, a feedback signal input, and an output, the delay-locked loop circuit being capable of driving a signal onto the input node of the balanced clock tree; and a plurality of output buffers, each of the output buffers having an input and an output, the input of each output buffer being coupled to a corresponding respective one of the output nodes of the balanced clock tree, wherein each output buffer is a part of an input/output interface cell, each input/output interface cell being configurable either as an input interface cell, an output interface cell, or a bidirectional interface cell, wherein one of the input/output interface cells is disposed adjacent to a first of the four edges, a second of the input/output interface cells is disposed adjacent to a second of the four edges, a third of the input/output interface cells is disposed adjacent to a third of the four edges, and a fourth of the input/output interface cells is disposed adjacent to a fourth of the four edges, wherein a feedback signal is driven off-the field programmable integrated circuit by one of the output buffers and is supplied back to the feedback signal input of the delay-locked loop circuit via a connection external to the field programmable integrated circuit.

6. The field programmable integrated circuit of claim 5, wherein the connection external to the field programmable integrated circuit is a non-branched connection.

7. The field programmable integrated circuit of claim 5, wherein the delay-locked loop circuit comprises a first delay-locked loop circuit and a second delay-locked loop circuit.

8. The field programmable integrated circuit of claim 5, wherein each input/output interface cell comprises a plurality of memory cells, the memory cells storing configuration information that determines how the input/output interface cell is configured.

9. An integrated circuit having four edges when viewed from a top-down perspective, the integrated circuit comprising:

means for conducting a clock signal from a balanced clock tree input node to a plurality of balanced clock tree output nodes;

a delay-locked loop circuit having a reference signal input, a feedback signal input, and an output, the delay-locked loop circuit being capable of driving the clock signal onto the balanced clock tree input node; and a plurality of output buffers, each of the output buffers having an input and an output, the input of each output buffer being coupled to a corresponding respective one of the balanced clock tree output nodes, wherein each of the output buffers is a part of an input/output interface cell, wherein one of the input/output interface cells is disposed adjacent to a first of the four edges, a second of the input/output interface cells is disposed adjacent to a second of the four edges, a third of the input/output interface cells is disposed adjacent to a third of the four edges, and a fourth of the input/output interface cells is disposed adjacent to a fourth of the four edges.

10. The integrated circuit of claim 9, wherein the means for conducting is fashioned substantially from a single layer of interconnect, and wherein the interconnect of the means for conducting has a width that varies from thick to thin as the means for conducting extends from the balanced clock tree input node to each of the plurality of balanced clock tree output nodes.

* * * * *